(12) United States Patent
Zhu

(10) Patent No.: US 11,049,888 B1
(45) Date of Patent: Jun. 29, 2021

(54) MANUFACTURING METHOD FOR TFT ARRAY SUBSTRATE

(71) Applicant: Shenzhen China Star Optoelectronics Technology Co., Ltd., Shenzhen (CN)

(72) Inventor: Maoxia Zhu, Shenzhen (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 460 days.

(21) Appl. No.: 16/307,469

(22) PCT Filed: Sep. 26, 2018

(86) PCT No.: PCT/CN2018/107763
§ 371 (c)(1),
(2) Date: Dec. 5, 2018

(87) PCT Pub. No.: WO2020/015172
PCT Pub. Date: Jan. 23, 2020

(30) Foreign Application Priority Data

Jul. 18, 2018 (CN) .......................... 201810793136.0

(51) Int. Cl.
*H01L 27/12* (2006.01)
(52) U.S. Cl.
CPC ...... *H01L 27/1274* (2013.01); *H01L 27/1288* (2013.01)
(58) Field of Classification Search
None
See application file for complete search history.

(56) References Cited

U.S. PATENT DOCUMENTS

| 6,337,175 B1 * | 1/2002 | Yamaguchi | G03F 7/0035 430/313 |
| 7,420,728 B2 * | 9/2008 | Tung | G02B 26/001 257/678 |

FOREIGN PATENT DOCUMENTS

CN 106298646 A 1/2017

\* cited by examiner

*Primary Examiner* — Michelle Mandala
(74) *Attorney, Agent, or Firm* — Leong C. Lei

(57) ABSTRACT

The manufacturing method for TFT array substrate of the invention exposes the negative photoresist material on the passivation layer with a semi-transmissive mask to form a crosslinked portion, first and second uncrosslinked portion; then, performs the first development to remove the first uncrosslinked portion and forms a via on the passivation layer, performs the ashing treatment for thinning the negative photoresist material to expose the second uncrosslinked portion, performs the second development to remove the second uncrosslinked portion; deposits transparent conductive material on negative photoresist material and exposed passivation layer to form a pixel electrode on passivation layer, and finally removes the remaining negative photoresist material and the transparent conductive material with photoresist stripping solution. The invention, using stepwise development, solves the technical difficulty of forming a halftone structure with a negative photoresist material, and enables feasibility of the use of the negative photoresist material in the 3mask process.

10 Claims, 5 Drawing Sheets

MANUFACTURING METHOD FOR TFT ARRAY SUBSTRATE

BACKGROUND OF THE INVENTION

1. Field of the Invention

The present invention relates to the field of display, and in particular to a thin film transistor (TFT) array substrate.

2. The Related Arts

In the field of display technology, a panel display device, such as liquid crystal display (LCD), active matrix organic light-emitting diode (AMOLED) display device, due to the advantages of thinness, high image quality, power saving, radiation-free, and so on, has been widely used in various applications, such as, mobile phone, PDA, digital camera, PC monitor and notebook PC monitor.

A thin film transistor (TFT) array substrate is the main component of current LCD devices and AMOLED devices, directly related to the development direction of high-performance panel display devices, and is used for providing driving circuits to display devices. The TFT array substrate is disposed with a plurality of scan lines and a plurality of data lines, the plurality of scan lines and the plurality of data lines define a plurality of pixel units, and each of the pixel units is provided with a TFT and a pixel electrode. The gate of the TFT is electrically connected to the corresponding scan line. When the voltage on the scan line reaches the turn-on voltage, the source and drain of the TFT are turned on, thereby inputting the data voltage on the data line to the pixel electrode, and further controls the display of the corresponding pixel area.

In the mass production line of semiconductor production, the photo equipment is the core and most expensive equipment, and the production capacity of the mass production line is based on the photo equipment. The excessive use of the masks increases the cost of the process aw well as the tact time, which greatly reduces production efficiency. Therefore, in the development of the semiconductor industry, decreasing the number of masks, increasing the production capacity, and reducing the cost are main targets. In the fabrication process of the TFT array substrate, the 6mask process is commonly used, and the recent transition to the 5mask process and the 4mask technology through the optimized design. The 4mask technology combines an active (AS) layer and a source-drain (S/D) layer to form a Halftone Mask (HTM) or a Gray Tone Mask (GTM). HTM or GTM allows the photoresist layer to have two different film thicknesses, which can be used to define the pattern of the AS layer and the SD layer, respectively.

To further reduce the number of masks, the industry uses a lift-off process to use a mask to simultaneously form a passivation (PV) layer and an indium tin oxide (ITO) layer for the pixel electrode, thereby the total number of masks is further reduced to three (3mask). But the 3mask process is usually only for Twisted Nematic (TN) LCD panels, and the ITO layer does not need to form a slit pattern; or, the ITO layer is deposited at the concave groove, and the entire ITO layer (including the pixel area) is in the groove of the passivation layer. But the transverse electric field of the electrode of the pixel is weakened, which affects the display effect of the LCD panel and forms uneven display brightness (mura).

With the development of technology, an improved 3mask technology is formed by sharing an ITO layer and a PV layer with a single HTM or GTM, so that the ITO layer in the pixel area can form the silt pattern and cover the PV layer. The 3mask technology usually uses an HTM and a positive photoresist to perform the yellow light process because the exposed portion of the positive photoresist is easily soluble in the developer solution, and after using the HTM, the photoresist exposed to different amounts of exposures can be made to have different photoresist thickness after development, therefore, able to reduces the number of masks. However, the positive photoresist is difficult to be lifted off after covered with ITO, which makes the lift-off effect poor and inefficient. When a negative photoresist is used for the lift-off process, since the upper layer of the negative photoresist is exposed to a larger amount than the lower layer, an undercut structure is formed after development, so that the ITO covering the photoresist layer will be broken at the undercut structure. When the lift-off solution is in contact with the photoresist to react quickly, the lift-off efficiency is improved. However, the negative photoresist is opposite to the positive photoresist. The exposed portion is crosslinked, is insoluble in the developer, and the unexposed portion is dissolving. If a step photoresist layer is to be formed, it is necessary to illuminate under the negative photoresist, so that the lower portion of the negative photoresist is developed and retained. But the illumination cannot be performed from below due to process limitation. That is to say, the difficulty of the existing 3mask technology is that the positive photoresist is difficult to be lifted off after covered by the ITO layer, so that the lift-off effect is poor and the efficiency is low. Negative photoresist is difficult to apply to the 3mask lift-off process due to the difficulty in forming a halftone structure.

SUMMARY OF THE INVENTION

The object of the present invention is to provide a manufacturing method for TFT array substrate, able to realize the effect of using a negative photoresist material for the lift-off process, and enable feasibility of the use of the negative photoresist material in the 3mask process.

To achieve the above object, the present invention provides a manufacturing method for TFT array substrate, which comprises:

Step S1: providing a base substrate, forming a gate, a gate insulating layer, an active layer, a source and a drain on the base substrate;

Step S2: forming a passivation layer covering the source and the drain on the base substrate;

Step S3: providing a semi-transmissive mask having a light-shielding pattern, a semi-transmissive pattern, and a remaining light-transmitting pattern, and coating a negative photoresist material on the passivation layer, using the semi-transmissive mask to perform exposure on the negative photoresist material; during exposure, crosslinking reaction not occurring to the negative photoresist material corresponding to the light-shielding pattern and a lower half portion of the negative photoresist material corresponding to the semi-transmissive pattern, and a first uncrosslinked portion and a second uncrosslinked portion being formed, respectively; and crosslinking reaction occurring to the negative photoresist material corresponding to the light-transmissive pattern and an upper half portion of the negative photoresist material corresponding to the semi-transmissive pattern, and a crosslinked portion being formed;

Step S4: performing a first development on the negative photoresist material, and removing the first uncrosslinked portion corresponding to the light-shielding pattern;

Step S5: using the negative photoresist material as a shielding layer to perform etching on the passivation layer to form a via above the drain and exposing the drain;

Step S6: performing an ashing treatment on the negative photoresist material, and thinning the negative photoresist material to expose the second uncrosslinked portion;

Step S7: performing a second development on the negative photoresist material, and removing the second uncrosslinked portion corresponding to the semi-transmissive pattern;

Step S8: depositing a transparent conductive material on the negative photoresist material and the passivation layer exposed by the negative photoresist material, thereby forming a pixel electrode on the passivation layer, and the pixel electrode contacting the drain through the via;

Step S9: removing the remaining negative photoresist material and the transparent conductive material thereon by using a photoresist stripping solution.

Step S1 specifically comprises the following steps:

Step S11: providing a base substrate, using a first mask process to pattern the base substrate to form a gate, forming a gate insulating layer covering the gate on the substrate;

Step S12: using a second mask process to pattern on the gate insulating layer to form an active layer, and a source and a drain respectively located on both ends of the active layer.

The semi-transmissive mask provided in step S3 is a halftone mask.

The semi-transmissive mask provided in step S3 is a grayscale mask.

In step S6, the negative photoresist material is subjected to the ashing treatment by using oxygen plasma.

The transparent conductive material deposited in step S8 is indium tin oxide.

The active layer is an amorphous silicon (a-Si) layer.

The passivation layer is made of silicon oxide, silicon nitride, silicon oxynitride, aluminum oxide or hafnium oxide.

The passivation layer is formed by plasma chemical vapor deposition, atmospheric pressure chemical vapor deposition or sputtering in step S2.

The passivation layer is etched by the wet etching method or the plasma dry etching method in step S5.

The present invention provides the following advantages: the manufacturing method for TFT array substrate of the present invention first coats a negative photoresist material on the passivation layer, and exposes the negative photoresist material with a semi-transmissive mask to form a crosslinked portion, an exposed first uncrosslinked portion, and a second uncrosslinked portion covered by the crosslinked portion; then, the first development is performed on the exposed negative photoresist material to remove the first uncrosslinked portion and form a via on the passivation layer, and the ashing treatment is performed on the negative-type photoresist material for thinning the negative photoresist material to expose the second uncrosslinked portion, a second development is performed on the negative photoresist material to remove the second uncrosslinked portion; a transparent conductive material is deposited on the negative photoresist material and the exposed passivation layer to form a pixel electrode on the passivation layer, and finally the remaining negative photoresist material and the transparent conductive material thereon is removed by using a photoresist stripping solution. The present invention, by using step-wise development, solves the technical difficulty of forming a halftone structure with a negative photoresist material, and realizes the effect of forming a passivation layer and a pixel electrode with a mask by using a negative photoresist material for a lift-off process, and reducing the number of masks, improves the lift-off efficiency, and enables feasibility of the use of the negative photoresist material in the 3mask process.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
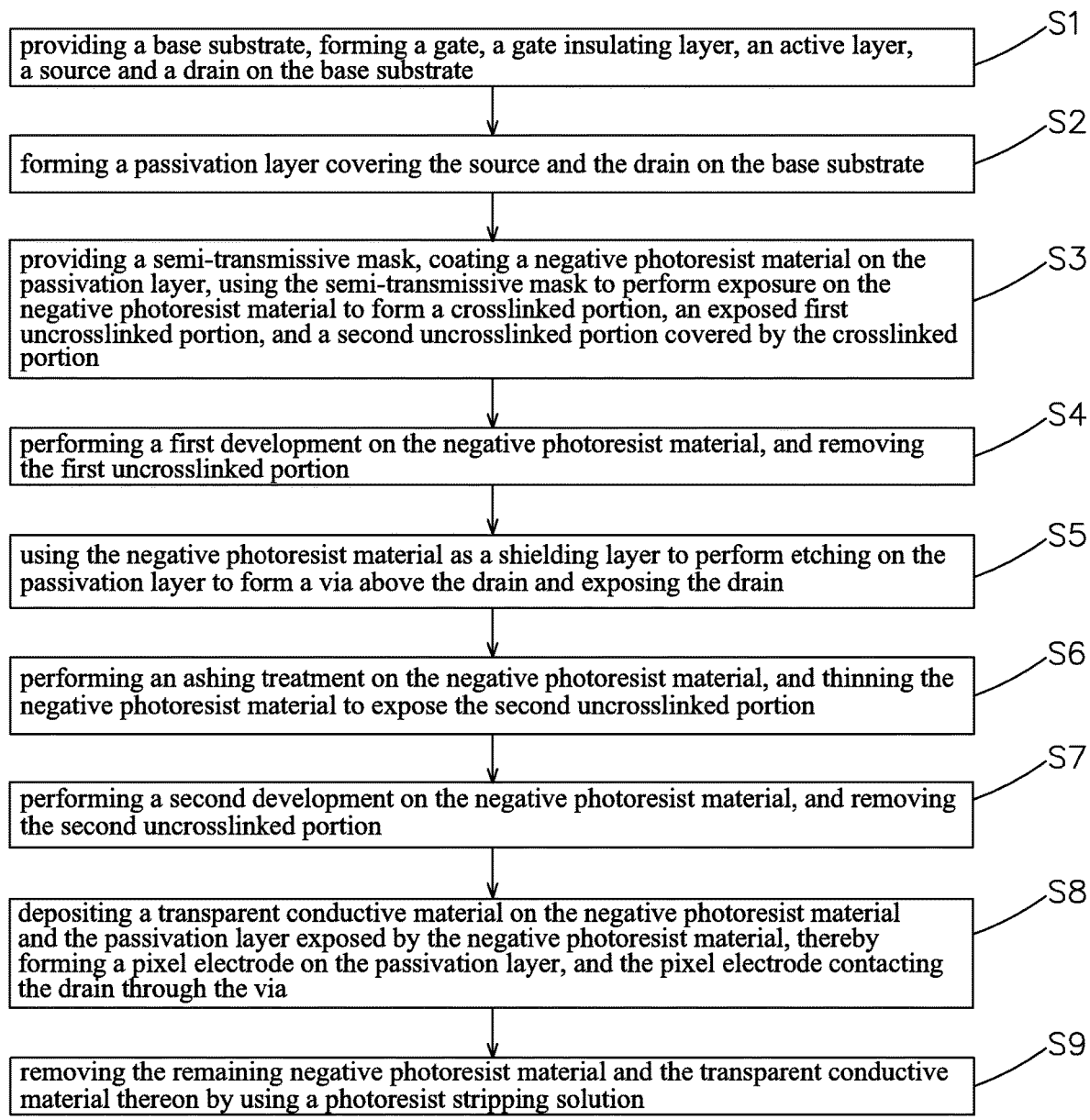
FIG. 1 is a schematic view showing the flowchart of the manufacturing method for TFT array substrate of the present invention.

Refer to FIG. 1. The present invention provides a manufacturing method for TFT array substrate, which comprises:

Step S1: providing a base substrate 10, forming a gate 20, a gate insulating layer 30, an active layer 40, a source 51 and a drain 52 on the base substrate 10.

Figure 2:
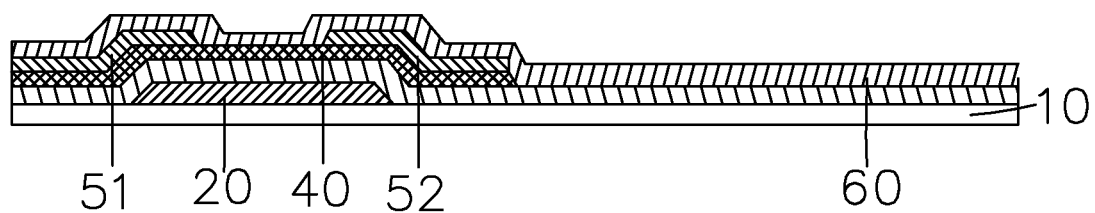
FIG. 2 is a schematic view showing step S2 of the manufacturing method for TFT array substrate of the present invention.

Step S2: as shown in FIG. 2, forming a passivation layer 60 covering the source 51 and the drain 52 on the base substrate 10.

Specifically, the passivation layer 60 is formed by plasma chemical vapor deposition, atmospheric pressure chemical vapor deposition or sputtering in step S2; the passivation layer 60 is made of silicon oxide, silicon nitride, silicon oxynitride, aluminum oxide or hafnium oxide.

Figure 3:
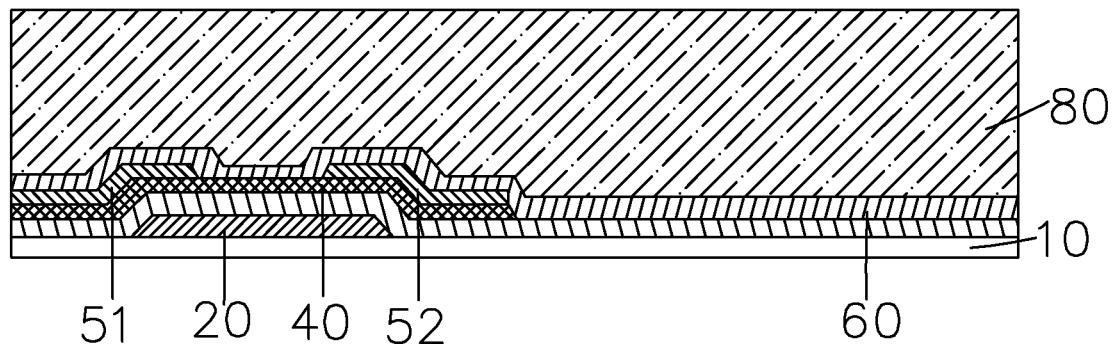
FIGS. 3-4 are schematic views showing step S3 of the manufacturing method for TFT array substrate of the present invention.
Figure 4:
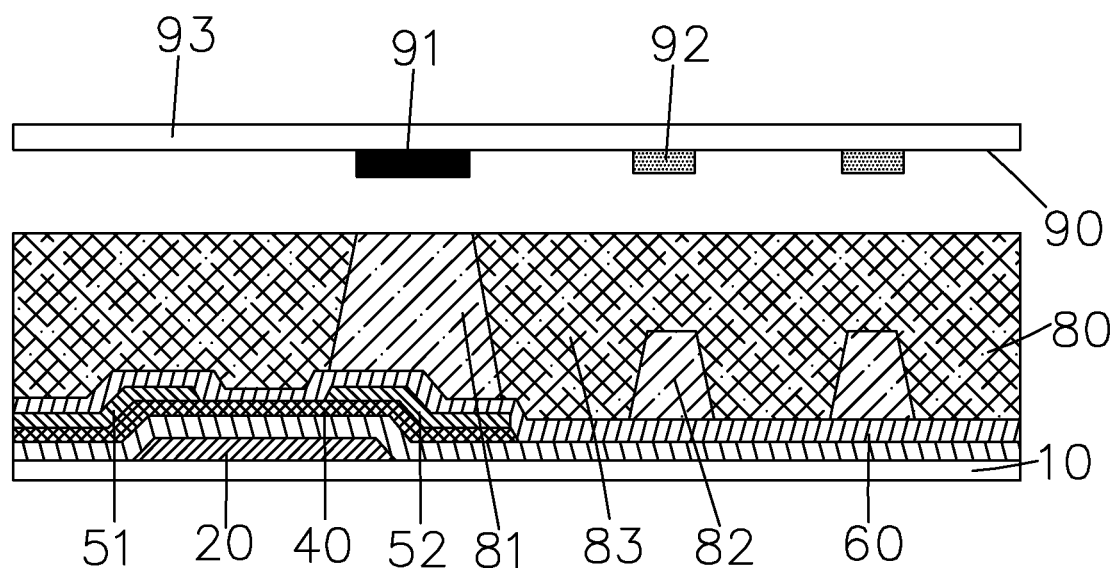

Step S3: as shown in FIGS. 3-4, providing a semi-transmissive mask 90 having a light-shielding pattern 91, a semi-transmissive pattern 92, and a remaining light-transmitting pattern 93, and coating a negative photoresist material 80 on the passivation layer 60, using the semi-transmissive mask 90 to perform exposure on the negative photoresist material 80; during exposure, crosslinking reaction not occurring to the negative photoresist material 80 corresponding to the light-shielding pattern 91 and a lower half portion of the negative photoresist material 80 corresponding to the semi-transmissive pattern 92, and a first uncrosslinked portion 81 and a second uncrosslinked portion 82 being formed, respectively; and crosslinking reaction occurring to the negative photoresist material 80 corresponding to the light-transmissive pattern 93 and an upper half portion of the negative photoresist material 80 corresponding to the semi-transmissive pattern 92, and a crosslinked portion 83 being formed.

Specifically, the semi-transmissive mask provided in step S3 is a halftone mask or a grayscale mask.

Figure 5:
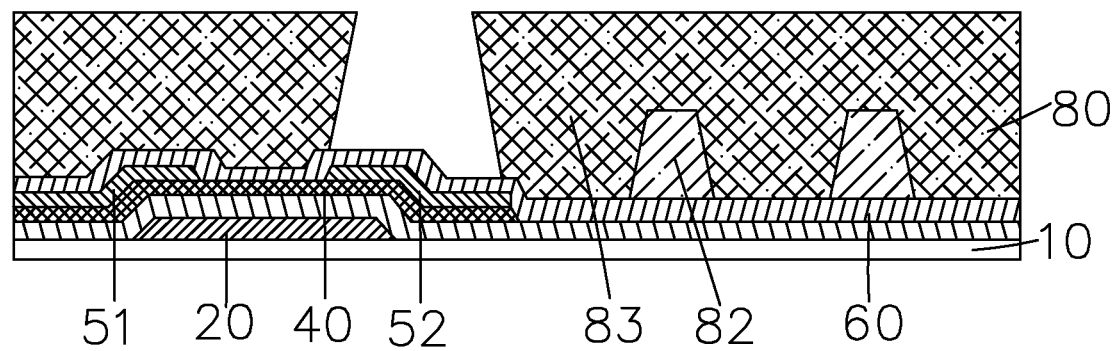
FIG. 5 is a schematic view showing step S4 of the manufacturing method for TFT array substrate of the present invention.

Step S4: as shown in FIG. 5, performing a first development on the negative photoresist material 80, and removing the first uncrosslinked portion 81 corresponding to the light-shielding pattern 91.

Figure 6:
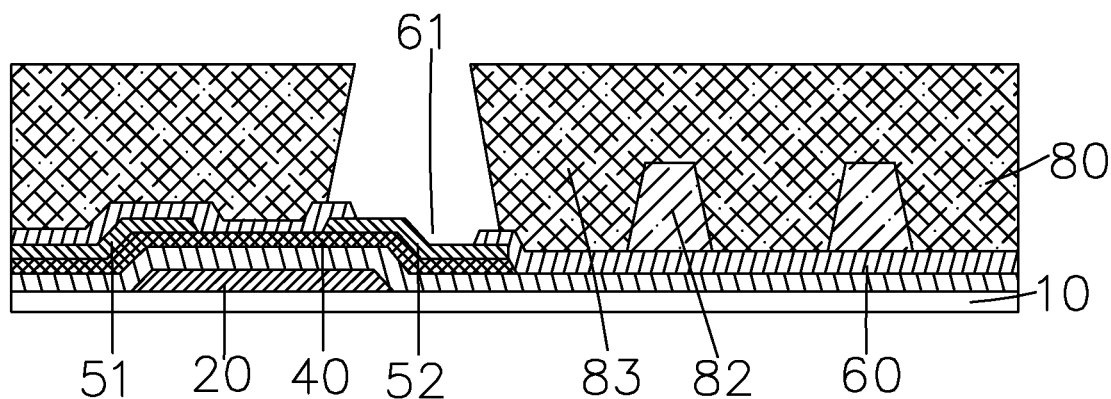
FIG. 6 is a schematic view showing step S5 of the manufacturing method for TFT array substrate of the present invention.

Step S5: as shown in FIG. 6, using the negative photoresist material 80 as a shielding layer to perform etching on the passivation layer 60 to form a via 61 above the drain 52 and exposing the drain 52.

Specifically, the passivation layer 60 is etched by the wet etching method or the plasma dry etching method in step S5.

Figure 7:
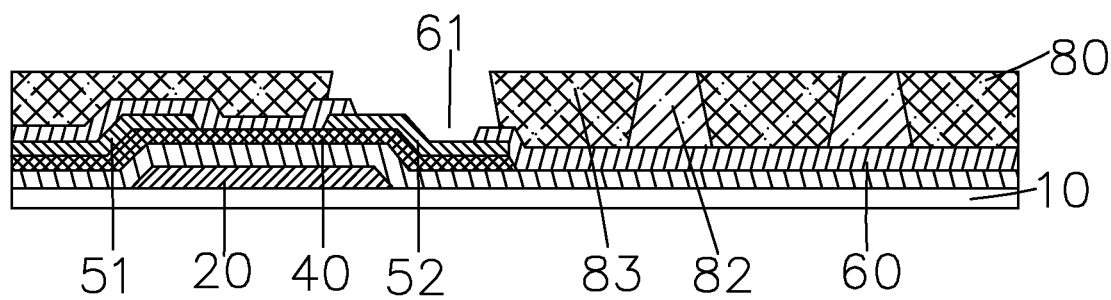
FIG. 7 is a schematic view showing step S6 of the manufacturing method for TFT array substrate of the present invention.

Step S6: as shown in FIG. 7, performing an ashing treatment on the negative photoresist material 80, and thinning the negative photoresist material 80 to expose the second uncrosslinked portion 82.

Specifically, in step S6, the negative photoresist material 80 is subjected to the ashing treatment by using oxygen plasma.

Figure 8:
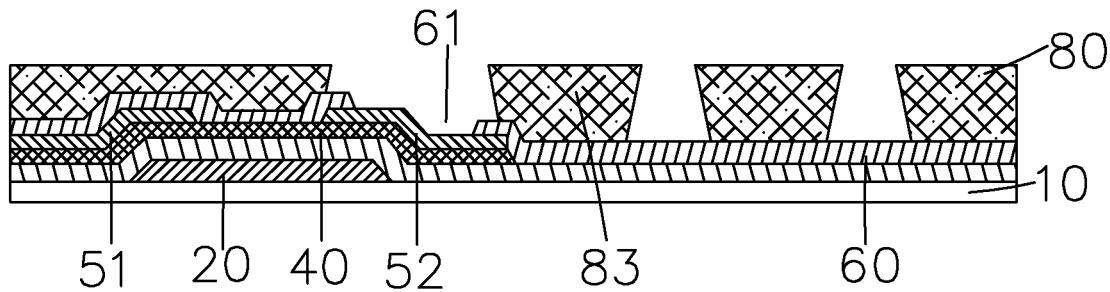
FIG. 8 is a schematic view showing step S7 of the manufacturing method for TFT array substrate of the present invention.

Step S7: as shown in FIG. 8, performing a second development on the negative photoresist material 80, and removing the second uncrosslinked portion 82 corresponding to the semi-transmissive pattern 92.

Figure 9:
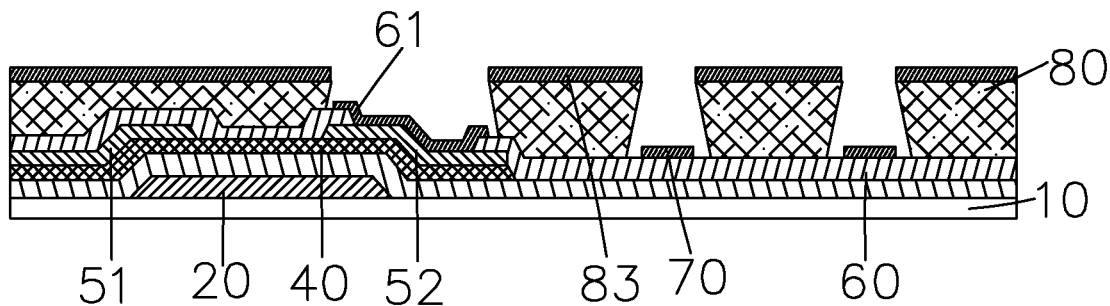
FIG. 9 is a schematic view showing step S8 of the manufacturing method for TFT array substrate of the present invention.

Step S8: as shown in FIG. 9, depositing a transparent conductive material on the negative photoresist material 80 and the passivation layer 60 exposed by the negative photoresist material 80, thereby forming a pixel electrode 70 on the passivation layer 60, and the pixel electrode 70 contacting the drain 52 through the via 61.

Specifically, the transparent conductive material deposited in step S8 is indium tin oxide.

It should be noted that after the first uncrosslinked portion 81 and the second uncrosslinked portion 82 are removed in the development process, corresponding photoresist vias are formed on the negative photoresist material 80. Because the exposure amount is gradually decreased from top to bottom on the negative photoresist material 80, the first uncrosslinked portion 81 and the second uncrosslinked portion 82 formed after the exposure are a structure having a wider upper portion and a narrower lower portion, and the corresponding photoresist vias formed by removing the first uncrosslinked portion 81 and the second uncrosslinked portion 82 also have a wider upper and narrower lower structure. As such, when the transparent conductive material is deposited, the transparent conductive material may be broken at the photoresist vias, i.e., a portion is deposited on the negative photoresist material 80, and another portion is deposited on the passivation layer 60 through the photoresist via to form the pixel electrode 70, and the two portions are disconnected from each other and are not continuous.

Figure 10:
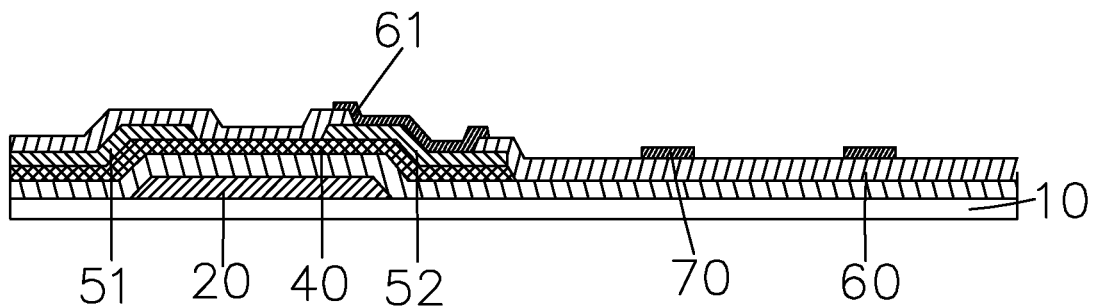
FIG. 10 is a schematic view showing step S9 of the manufacturing method for TFT array substrate of the present invention.

Step S9: as shown in FIG. 10, removing the remaining negative photoresist material 80 and the transparent conductive material thereon by using a photoresist stripping solution.

Specifically, since the transparent conductive material on the negative photoresist material 80 is not continuous with the pixel electrode 70 on the passivation layer, the negative photoresist material 80 and the transparent conductive material thereon can be effectively stripped in step S9, which improves lift-off efficiency.

Specifically, the present invention adopts a 3mask technical process to manufacture TFT array substrate, and step S1 specifically comprises the following steps:

Step S11: providing a base substrate 10, using a first mask process to pattern the base substrate 10 to form a gate 20, forming a gate insulating layer 30 covering the gate 20 on the substrate 10;

Step S12: using a second mask process to pattern on the gate insulating layer 30 to form an active layer 40, and a source 51 and a drain 52 respectively located on both ends of the active layer 40.

Specifically, the semi-transmissive mask 90 used in step S3 is the third mask process.

Specifically, the active layer 40 is an amorphous silicon (a-Si) layer. The process of forming the gate 20, patterning the active layer 40, the source 51, and the drain 52 can be performed as in the prior art, and details are not described herein.

It should be noted that the foregoing embodiment describes the present invention by using a 3mask process, but the present invention is not limited to this application. The present invention is applicable to all TFT display technologies having a structure with a passivation layer 60, a via 61, and a pixel electrode 70, and the passivation layer 60, the via 61 and the pixel electrode 70 are formed simultaneously in the same mask process.

The manufacturing method for TFT array substrate of the present invention coats a negative photoresist material 80 on the passivation layer 60, and exposes the negative photoresist material 80 with a semi-transmissive 90 mask to form a crosslinked portion 93, an exposed first uncrosslinked portion 91, and a second uncrosslinked portion 92 covered by the crosslinked portion 93; then, the first development is performed on the exposed negative photoresist material 80 to remove the first uncrosslinked portion 91 and form a via 61 on the passivation layer 60, and the ashing treatment is performed on the negative-type photoresist material 80 for thinning the negative photoresist material 80 to expose the second uncrosslinked portion 92, a second development is performed on the negative photoresist material 80 to remove the second uncrosslinked portion 92; a transparent conductive material is deposited on the negative photoresist material 80 and the exposed passivation layer 60 to form a pixel electrode 70 on the passivation layer 60, and finally the remaining negative photoresist material 80 and the transparent conductive material thereon is removed by using a photoresist stripping solution. The present invention, by using step-wise development, solves the technical difficulty of forming a halftone structure with a negative photoresist material 80, and realizes the effect of forming a passivation layer 60 and a pixel electrode 70 with a mask by using a negative photoresist material 80 for a lift-off process, and reducing the number of masks, improves the lift-off efficiency, and enables feasibility of the use of the negative photoresist material in the 3mask process.

In summary, the manufacturing method for TFT array substrate of the present invention first coats a negative photoresist material on the passivation layer, and exposes the negative photoresist material with a semi-transmissive mask to form a crosslinked portion, an exposed first uncrosslinked portion, and a second uncrosslinked portion covered by the crosslinked portion; then, the first development is performed on the exposed negative photoresist material to remove the first uncrosslinked portion and form a via on the passivation layer, and the ashing treatment is performed on the negative-type photoresist material for thinning the negative photoresist material to expose the second uncrosslinked portion, a second development is performed on the negative photoresist material to remove the second uncrosslinked portion; a transparent conductive material is deposited on the negative photoresist material and the exposed passivation layer to form a pixel electrode on the passivation layer, and finally the remaining negative photoresist material and the transparent conductive material thereon is removed by using a photoresist stripping solution. The present invention, by using step-wise development, solves the technical difficulty of forming a halftone structure with a negative photoresist material, and realizes the effect of forming a passivation layer and a pixel electrode with a mask by using a negative photoresist material for a lift-off process, and reducing the number of masks, improves the lift-off efficiency, and enables feasibility of the use of the negative photoresist material in the 3mask process.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A manufacturing method for thin film transistor (TFT) array substrate, comprising:
    Step S1: providing a base substrate, forming a gate, a gate insulating layer, an active layer, a source and a drain on the base substrate;
    Step S2: forming a passivation layer covering the source and the drain on the base substrate;
    Step S3: providing a semi-transmissive mask having a light-shielding pattern, a semi-transmissive pattern, and a remaining light-transmitting pattern, and coating a negative photoresist material on the passivation layer, using the semi-transmissive mask to perform exposure on the negative photoresist material; during exposure, crosslinking reaction not occurring to the negative photoresist material corresponding to the light-shielding pattern and a lower half portion of the negative photoresist material corresponding to the semi-transmissive pattern, and a first uncrosslinked portion and a second uncrosslinked portion being formed, respectively; and crosslinking reaction occurring to the negative photoresist material corresponding to the light-transmissive pattern and an upper half portion of the negative photoresist material corresponding to the semi-transmissive pattern, and a crosslinked portion being formed;
    Step S4: performing a first development on the negative photoresist material, and removing the first uncrosslinked portion corresponding to the light-shielding pattern;
    Step S5: using the negative photoresist material as a shielding layer to perform etching on the passivation layer to form a via above the drain and exposing the drain;
    Step S6: performing an ashing treatment on the negative photoresist material, and thinning the negative photoresist material to expose the second uncrosslinked portion;
    Step S7: performing a second development on the negative photoresist material, and removing the second uncrosslinked portion corresponding to the semi-transmissive pattern;
    Step S8: depositing a transparent conductive material on the negative photoresist material and the passivation layer exposed by the negative photoresist material, thereby forming a pixel electrode on the passivation layer, and the pixel electrode contacting the drain through the via;
    Step S9: removing the remaining negative photoresist material and the transparent conductive material thereon by using a photoresist stripping solution.

2. The manufacturing method for TFT array substrate as claimed in claim 1, wherein step S1 specifically comprises:
    Step S11: providing a base substrate, using a first mask process to pattern the base substrate to form a gate, forming a gate insulating layer covering the gate on the substrate;
    Step S12: using a second mask process to pattern on the gate insulating layer to form an active layer, and a source and a drain respectively located on both ends of the active layer.

3. The manufacturing method for TFT array substrate as claimed in claim 1, wherein semi-transmissive mask provided in step S3 is a halftone mask.

4. The manufacturing method for TFT array substrate as claimed in claim 1, wherein semi-transmissive mask provided in step S3 is a grayscale mask.

5. The manufacturing method for TFT array substrate as claimed in claim 1, wherein in step S6, the negative photoresist material is subjected to the ashing treatment by using oxygen plasma.

6. The manufacturing method for TFT array substrate as claimed in claim 1, wherein the transparent conductive material deposited in step S8 is indium tin oxide.

7. The manufacturing method for TFT array substrate as claimed in claim 2, wherein the active layer is an amorphous silicon (a-Si) layer.

8. The manufacturing method for TFT array substrate as claimed in claim 1, wherein passivation layer is made of silicon oxide, silicon nitride, silicon oxynitride, aluminum oxide or hafnium oxide.

9. The manufacturing method for TFT array substrate as claimed in claim 1, wherein the passivation layer is formed by plasma chemical vapor deposition, atmospheric pressure chemical vapor deposition or sputtering in step S2.

10. The manufacturing method for TFT array substrate as claimed in claim 1, wherein the passivation layer is etched by the wet etching method or the plasma dry etching method in step S5.

* * * * *